US008204927B1

(12) United States Patent
Duong et al.

(10) Patent No.: US 8,204,927 B1
(45) Date of Patent: Jun. 19, 2012

(54) SYSTEM AND METHOD FOR COGNITIVE PROCESSING FOR DATA FUSION

(75) Inventors: Tuan A. Duong, Glendora, CA (US); Vu A. Duong, Rosemead, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 13/042,196

(22) Filed: Mar. 7, 2011

Related U.S. Application Data

(60) Provisional application No. 61/314,055, filed on Mar. 15, 2010.

(51) Int. Cl.
G06G 7/02 (2006.01)
(52) U.S. Cl. ...................................................... 708/819
(58) Field of Classification Search .......... 708/800–854, 708/1–9
See application file for complete search history.

(56) References Cited

U.S. PATENT DOCUMENTS

| | | | |
|---|---|---|---|
| 5,155,802 A | 10/1992 | Mueller et al. | |
| 6,910,060 B2* | 6/2005 | Langan et al. | 708/819 |
| 2002/0059152 A1 | 5/2002 | Carson et al. | |
| 2006/0206555 A1 | 9/2006 | Nomura et al. | |
| 2008/0065334 A1 | 3/2008 | Duong et al. | |
| 2009/0116747 A1 | 5/2009 | Duong et al. | |
| 2010/0166297 A1 | 7/2010 | Raymond et al. | |

OTHER PUBLICATIONS

PCT International Search Report for PCT/US2011/027402 with a mailing date of Nov. 24, 2011.
PCT Written Opinion for PCT/US2011/027402 with a mailing date of Nov. 24, 2011.
J. S. Albus, 1971, "A theory of cerebellar function," *Mathematical Biosciences*, vol. 10, pp. 25-61.
M. Cohen, and S. Grossberg, "Absolute stability of global pattern formation and parallel memmory stage by competitive neural networks," *IEEE Trans. Systems, Man, Cybernetics*, vol. SMC-13, pp. 815-826, 1983.
S. E. Fahlman and C. Lebiere, "The Cascade Correlation learning architecture," *Advances in Neural Information Processing Systems II*, Ed: D. Touretzky, Morgan Kaufmann, San Mateo, CA, pp. 524-532, 1990.
K. Fukushima, S Miyake, "Neocognitron: A new algorithm for pattern recognition tolerant of deformations and shifts in position," *Pattern Recognition*, 15 (6), pp. 455-469, 1982.
J. J. Hopfield, "Neural networks and physical systems with emergent collective computational abilities," *Proc. Natl. Acad. Sci. USA*, vol. 79, pp. 2554-2558, 1982.
I. R. Jackson, "Convergence properties of radial basis functions", *Constructive Approximation*, vol. 4, 243-264, 1988.
B. Kosko, "Bidirectional associative memories," *IEEE Trans. Systems, Man and Cybernetics*, vol. 18, N# 1, pp. 49-60, 1988.
F. Rosenblatt, "The perceptron: A probabilistic model for information storage and organization in the brain," *Psychology Review*, vol. 65, pp. 386-408, 1958.
T.A. Duong, S.P. Eberhardt, T. Daud, and A. Thakoor, "Learning in neural networks: VLSI implementation strategies," *Fuzzy logic and Neural Network Handbook*, Chap. 27, Ed: C.H. Chen, McGraw-Hill, 1996.

(Continued)

*Primary Examiner* — Tan V. Mai
(74) *Attorney, Agent, or Firm* — Steinfl & Bruno, LLP

(57) ABSTRACT

A system and method for cognitive processing of sensor data. A processor array receiving analog sensor data and having programmable interconnects, multiplication weights, and filters provides for adaptive learning in real-time. A static random access memory contains the programmable data for the processor array and the stored data is modified to provide for adaptive learning.

15 Claims, 11 Drawing Sheets

OTHER PUBLICATIONS

E. Fiesler, T. Duong, and A. Trunov, "Design of neural network-based microchip for color segmentation," *SPIE Proceeding of Applications and Science of Computational Intelligence part III*, vol. 4055, pp. 228-237, Florida, May 2000.

T.X. Brown, M.D. Tran, T.A. Duong, T.Daud, and A.P. Thakoor, *Cascaded VLSI neural network chips: Hardware learning for pattern recognition and classification*, Simulation, 58, 340-347,1992 (Abstract Only).

T.A. Duong, T. Daud, "On-Chip Learning of Hyper-Spectra Data for Real-Time Target Recognition", *Proceeding of IASTED Intelligent System and Control*, pp. 305-308, Honolulu, Hawai, Aug. 14-16, 2000.

B. Girau, "On-Chip learning of FPGA-Inspired neural nets," *Proceeding of Internaltional of Neural Networks IJCNN'2001*, vol. 1, pp. 222-227, 2001.

C. Lu, B. Shi, and L. Chen, "A Programmable on-chip learning neural network with enhance characteristics," *The 2001 IEEE Inter. Symposium Circuit and Systems ISCAS 2001*, vol. 2, pp. 573-576, 2001.

G.M. Bo, D.D. Caviglia, and M. Valle, "An on-chip learning neural network," *Proc. Inter. Neural Networks IJCNN'2000*, vol. 4, pp. 66-71, 2000.

T. A. Duong and Allen R. Stubberud, "Convergence Analysis of Cascade Error Projection—An Efficient Learning Algorithm for Hardware Implementation," *International Journal of Neural System*, vol. 10, No. 3, pp. 199-210, Jun. 2000.

Hoehfeld, M. and Fahlman, S., "Learning with limited numerical precision using the cascade-correlation algorithm," *IEEE Trans. Neural Networks*, vol. 3, No. 4, pp. 602-611, 1992.

P. W. Hollis, J.S. Harper, and J.J. Paulos, "The effects of Precision Constraints in a Backpropagation learning Network," *Neural Computation*, vol. 2, pp. 363-373, 1990 (Abstract Only).

Bell and Sejnowski, 1995, "An information-maximisation approach to blind separation and blind deconvolution." Neural Computation 7, vol. 6, pp. 112901159.

T. A. Duong and Vu. A. Duong *"Real Time Adaptive Color Segmentation for Mars Landing Site Identification,"* Journal of Advanced Computational Intelligence and Intelligent Informatics, pp. 289-293, vol. 7 No. 3, 2003 (Abstract Only).

T.A. Duong, M. Ryan and V. A. Duong, *"Smart ENose for Detection of Selective Chemicals in an Unknown Environment."* Special issue of Journal of Advanced Computational Intelligence and Intelligent Informatics, vol. 11, No. 10, pp. 1197-1203, 2007.

\* cited by examiner

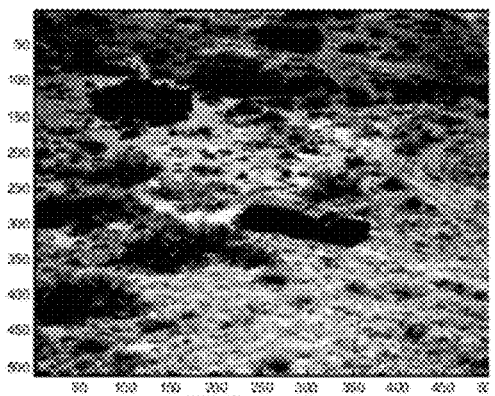
FIG. 7A
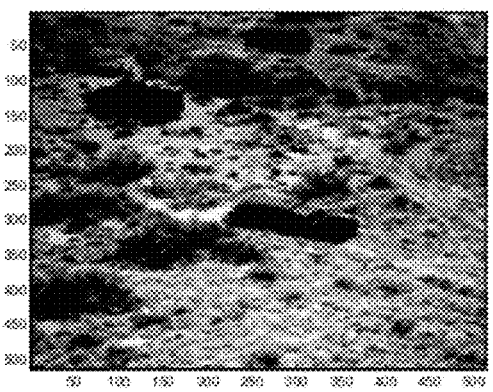
FIG. 7B
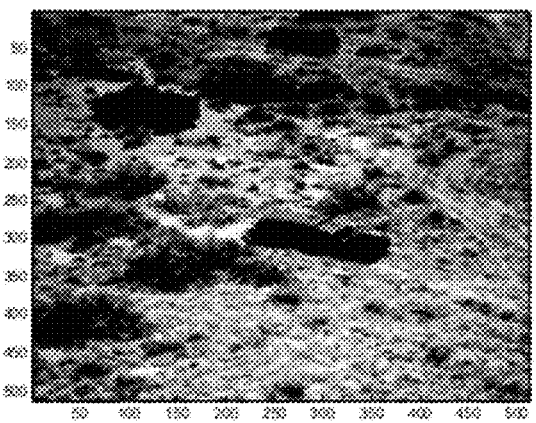
FIG. 7C
FIG. 7D
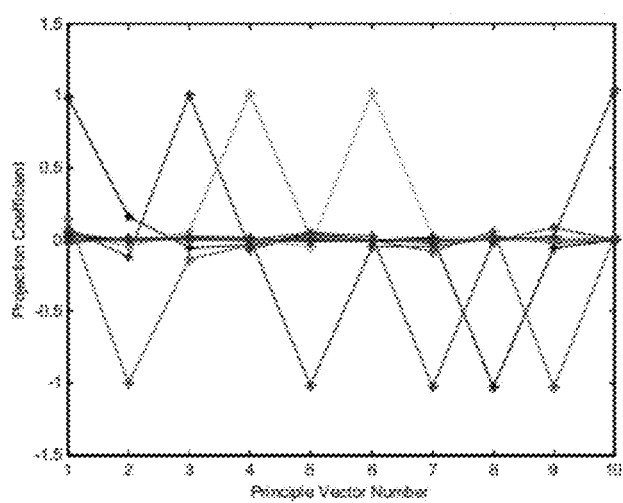

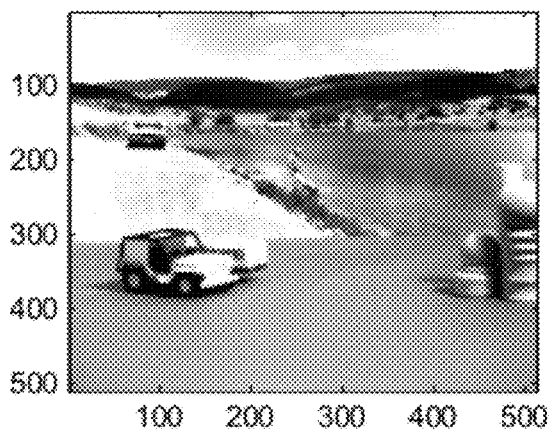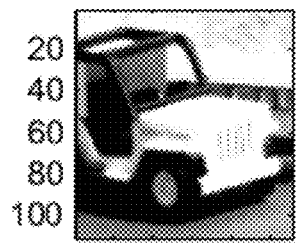
FIG. 17A
FIG. 17B
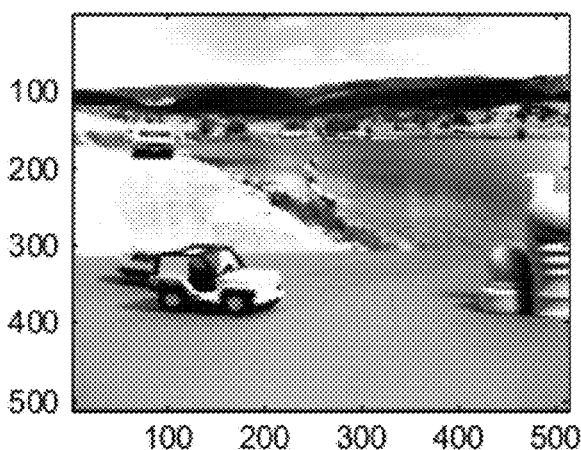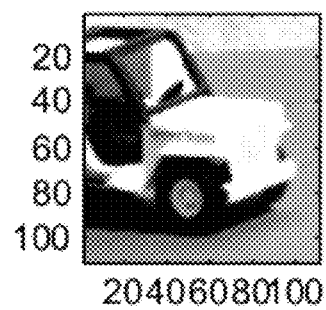
FIG. 18A
FIG. 18B
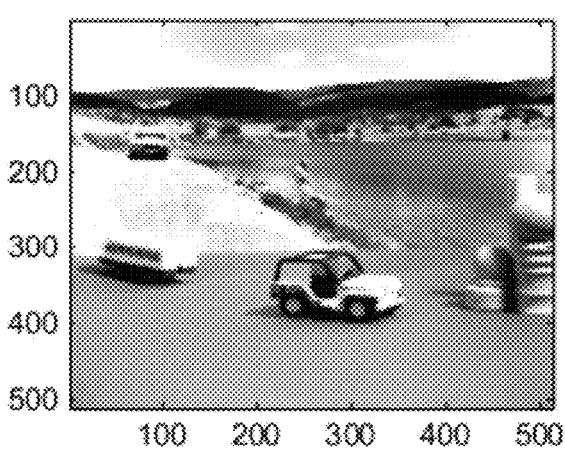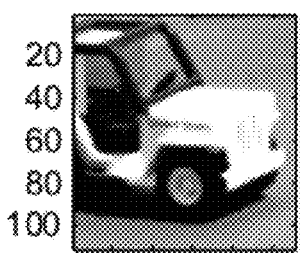
FIG. 19A
FIG. 19B

SYSTEM AND METHOD FOR COGNITIVE PROCESSING FOR DATA FUSION

CROSS-REFERENCE TO RELATED APPLICATIONS

This application is related to and claims the benefit of the following copending and commonly assigned U.S. Provisional Patent Application: U.S. Patent Application No. 61/314,055, titled "Real Time Cognitive Computing Architecture for Data Fusion in a Dynamic Environment," filed on Mar. 15, 2010; the entire contents of which is incorporated herein by reference.

STATEMENT OF GOVERNMENT GRANT

The invention described herein was made in the performance of work under a NASA contract, and is subject to the provisions of Public Law 96-517 (35 USC 202) in which the Contractor has elected to retain title.

BACKGROUND

1. Field

This disclosure relates to a system and method for real time cognitive processing for data fusion in a dynamic environment. More particularly, the present disclosure describes a method and system for real-time, adaptive, intelligent, low power, high productive and miniaturized processing using custom VLSI design for target detection and classification.

2. Description of Related Art

A general purposed computer can typically simulate or support just about any application through iterated computation in a sequential manner. Such general purpose computers typically use an architecture known as a Von Neumann architecture that consists of input/output, memory, and an Arithmetic Logic Unit. The Von Neumann architecture (or Von Neumann machine) is a sequential computation architecture. One draw back of the Von Neumann architecture is that it is slow, regardless of computer speed.

To deal with complex data fusion applications as required in military applications, particularly remote, real time applications related to the dynamic environment, the Von Neumann machine may not be effective for demands such as compactness, real time processing, adaptive system and low power. There are many types of data (e.g., IR, LIDAR, RADAR, Visual, Olfactory) that need to be processed and fused in real time. In data processing and fusion, especially for sensors, time can be critical to every millisecond. The speed requirements may present a challenge for a digital computer and the architecture of a system as a whole. For example, sensors may collect analog data that will be converted to a digital format before sending the data to the digital machine in a sequential manner for algorithmic computation. Each sequential step requires a delay and processing time to digest data, and finally, the solution that is provided by the computer may no longer be valid.

In contrast, a neural network architecture is a parallel processing technique and its performance can be much faster as compared with the digital machines. See, for example, J. J. Hopfield, "Neural networks and physical systems with emergent collective computational abilities," Proc. Natl. Acad. Sci. USA, vol. 79, pp. 2554-2558, 1982 and T. A. Duong, S. P. Eberhardt, T. Daud, and A. Thakoor, "Learning in neural networks: VLSI implementation strategies," Fuzzy logic and Neural Network Handbook, Chap. 27, Ed: C. H. Chen, McGraw-Hill, 1996. However, neural network hardware is typically not as fully-programmable as a digital computer. In neural network, one computer (or set of computers) may perform the learning and download a weight set to a neural network chip (see for example, E. Fiesler, T. Duong, and A. Trunov, "Design of neural network-based microchip for color segmentation," SPIE Proceeding of Applications and Science of Computational Intelligence part III, Vol. 4055, pp. 228-237, Florida, May 2000, and T. X. Brown, M. D. Tran, T. A. Duong, T. Daud, and A. P. Thakoor, Cascaded VLSI neural network chips: Hardware learning for pattern recognition and classification, Simulation, 58, 340-347, 1992), while another computer (or set of computers) can perform on-chip learning with limited programming capability (i.e., not flexible for other applications) (see, for example, T. A. Duong, T. Daud, "On-Chip Learning of Hyper-Spectra Data for Real-Time Target Recognition", Proceeding of IASTED Intelligent System and Control, pp. 305-308, Honolulu, Hi., August 14-17, 2000; B. Girau, "On-Chip learning of FPGA-Inspired neural nets," Proceeding of International of Neural Networks IJCNN'2001, Vol. 1, pp. 212-215, 2001; C. Lu, B. Shi, and L. Chen, "A Programmable on-chip learning neural network with enhance characteristics," The 2001 IEEE Inter. Symposium Circuit and Systems ISCAS 2001, Vol. 2, pp. 573-576, 2001; and G. M. Bo, D. D. Caviglia, and M. Valle, "An on-chip learning neural network," Proc. Inter. Neural Networks IJCNN'2000, Vol. 4, pp. 66-71, 2000). A neural network hardware implementation also has a two-fold problem: reliable learning techniques in limited weight space for learning network convergence in a parallel architecture (see, for example, T. A. Duong and Allen R. Stubberud, "Convergence Analysis Of Cascade Error Projection—An Efficient Learning Algorithm For Hardware Implementation," International Journal of Neural System, Vol. 10, No. 3, pp. 199-210, June 2000; Hoehfeld, M. and Fahlman, S., "Learning with limited numerical precision using the cascade-correlation algorithm," IEEE Trans. Neural Networks, vol. 3, No. 4, pp. 602-611, 1992; and P. W. Hollis, J. S. Harper, and J. J. Paulos, "The Effects of Precision Constraints in a Backpropagation learning Network," Neural Computation, vol. 2, pp. 363-373, 1990), and a flexible architecture to solve a wide range of problems. To break these problems, one must devise a reliable learning neural network technique that is able to learn under a limited weight space in milliseconds and a novel architecture that is fully programmable through instruction sets, from which the real time adaptive network in a chip can be achieved to solve a real time applications in a dynamic environment.

Hence, there is a need in the art for a fully programmable processing architecture that can address complex data fusion applications in a dynamic environment.

SUMMARY

Embodiments of the present invention comprise a system and method for cognitive processing of sensor data. A processor array receiving analog sensor data and having programmable interconnects, multiplication weights, and filters may provide for adaptive learning in real-time. A static random access memory may contain the programmable data for the processor array and the stored data is modified to provide for adaptive learning.

One embodiment of the present invention is a system for processing sensor data comprising: an input/output bus, wherein the input/output bus receives sensor data and outputs processed sensor data; a processor array, wherein the processor array receives analog signals containing sensor data from the input/output bus and the processor array comprises one or more matrices of analog multiplication nodes and transfer function elements and the processor array outputs processed sensor data from the one or more matrices of analog multiplication nodes and transfer function elements; and a memory containing data values controlling configurations of the processor array.

Another embodiment of the present invention is a method for processing sensor data comprising: receiving sensor data in a plurality of first analog data streams; applying a first set of multiplicative weights to the plurality of first analog data streams to produce a plurality of first multiplied analog data streams; filtering the plurality of first multiplied analog data streams based on a first set of filter characteristics to produce a plurality of preprocessed analog data streams; providing a plurality of second analog data streams based on the plurality of preprocessed analog data streams; applying a second set of multiplicative weights to the plurality of second analog data streams to produce a second plurality of multiplied analog data streams; filtering the second plurality of multiplied analog data streams based on a second set of filter characteristics to produce a plurality of processed analog data streams; and outputting the plurality of processed analog data streams to produce processed sensor data.

BRIEF DESCRIPTION OF THE SEVERAL VIEWS OF THE DRAWINGS

FIGS. 7A-7C show a tank image and results from reconstructing the tank image.

FIG. 7D shows the results of a 10 component vector extracted from the tank image shown in FIG. 7A.

FIGS. 11A-19B show various views of a scene and an object to be detected and tracked within the various views of that scene.

DETAILED DESCRIPTION

Figure 1:
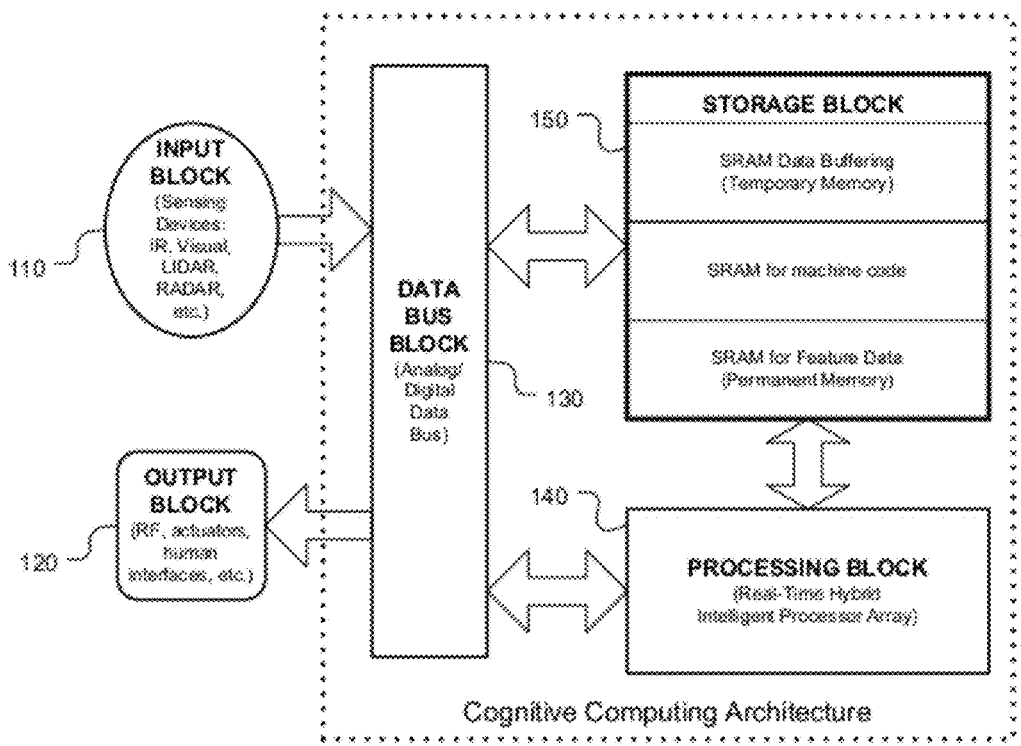
FIG. 1 shows a system block diagram including a Cognitive Computing Architecture.

A system block diagram comprising an embodiment of the present invention having a Cognitive Computing Architecture is shown in FIG. 1. As shown on FIG. 1, the system 100 comprises an input block 110, an output block 120, a data bus block 130, a processing block 140 and a storage block 150. The input block 110 may comprise sensing devices such as Infrared (IR) sensors, Light Detection and Ranging (LIDAR) sensors, Radio Detection and Ranging (RADAR) sensors, visuals sensors, chemical sensors, bio-sensors, olfactory sensors, and any other such sensors. The output block 120 may comprise devices that provide output signals to other receiving elements. The output signals may include, but are not limited to, visual indicators, electrical signals, mechanical actuation signals, radio-frequency signals. The other receiving elements may comprise elements such as machines, humans, or computing devices. The processing block 140 may be configured to process fully parallel analog data from the input block 110 via the data bus block 130 to allow real time processing. The processing block 140 may comprise processing techniques such as Principal Component Analysis (PCA), Independent Component Analysis (ICA), Neural Network (NN), Genetic Algorithm (GA), or other techniques. In a preferred embodiment of the present invention, the processing block 140 is capable of reconfiguration and adaptation as required when a target is changing in a dynamic environment. Moreover, the processing block 140 or portions of the processing block 140 may be configured to a particular architecture as determined by processing requirements, e.g. preprocessing, processing, static or adaptive requirements. The storage block 150 may store knowledge of data collected, instead of raw or information data as typically done with current computing architectures, e.g. digital machine. When required, knowledge data in the storage block 150 can be reconstructed to obtain the raw data. This capability may be considered as a cognitive approach.

Figure 2:
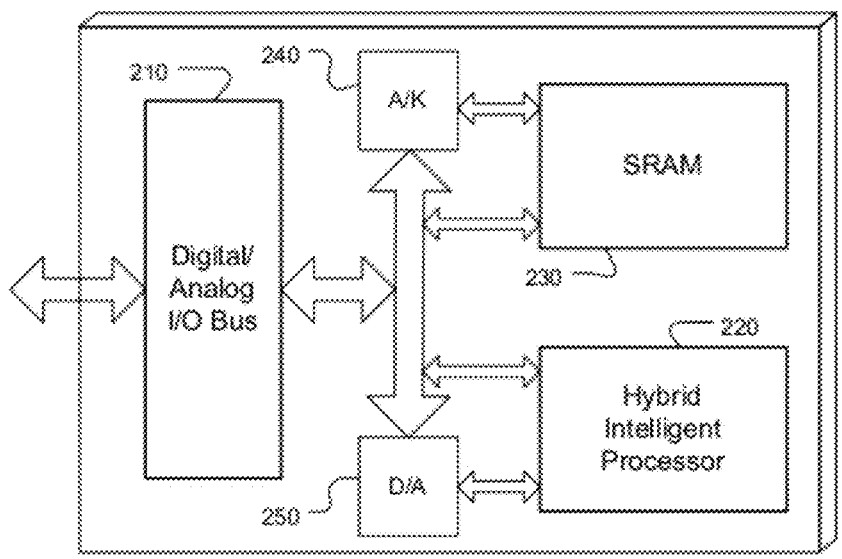
FIG. 2 shows a Cognitive Computing Architecture.

An embodiment of the present invention comprises a Cognitive Computing Architecture 200 which includes a Digital/Analog I/O Bus 210, Hybrid Intelligent Processor Array 220, and Static Random Access Memory (SRAM) 230 is shown in FIG. 2. These elements are described in additional detail below. In the architecture depicted in FIG. 2, the I/O Bus 210 may be configured to receive digital or analog data, but the Processor Array 220 is configured to operate on analog data. Therefore a digital to analog converter 250 may be used to convert digital input data into analog data for processing by the Processor Array 220 or other portions of the architecture. The architecture may also include an analog to knowledge element 240 that provides the ability to extract knowledge features (in a digital representation) from an analog stream for storage in or access by the SRAM 230.

As shown in FIG. 2, the I/O bus 210 is able to accommodate both analog and digital signals. With this hybrid I/O scheme, the Processor Array 220 can reduce I/O bottleneck and perform fully parallel and high speed computation for adaptive learning and execution operations, while maintaining a digital data format for instruction sets and network reconfiguration. Moreover, the hybrid I/O will be a natural retrofit to multiple sensory data types (e.g., IR, visual data etc.). The I/O bus may accommodate several streams of analog input data. In a preferred embodiment, the input data bus may comprise 128 analog data lines, which, if a 10 bit digital resolution were assumed, would comprise a 1280 bit (128×10 bits) data bus.

The SRAM 230 may be to store the instruction codes, system configurations, and/or digital data sets. It may also reconfigure the network within the Processor Array 220 so that it can be programmed to a particular set of processors suitable for a particular application using a reconfigurable computing technique (such as Field Programmable Array, System on a Chip, network processor, etc.). The SRAM may also store feature data, not raw data as in traditional approaches. Accesses to the SRAM would then allow reconstruction of the raw information if needed. The form of feature data is the knowledge as selected information and enables the readiness of use as cognitive processing.

The Hybrid Intelligent Processor Array 220 is an adaptive processor comprising a matrix of, preferably, 10-bit connection strength (weight) and an array of processing units. Depending on the data type(s) from one or multiple sources, one or several data filters can be reconfigured to perform adaptive learning in real time. The data rates of different types of sensory data do not necessarily have to be the same. To perform the real time adaptive learning, the instruction set is stored in SRAM and may run as fast as the raw data rate in the sensor I/O channels. The Processor Array 220 configuration allows for high speed, fully parallel, and low power processing since sensory input signals are in analog, fully parallel and asynchronous.

Figure 3:
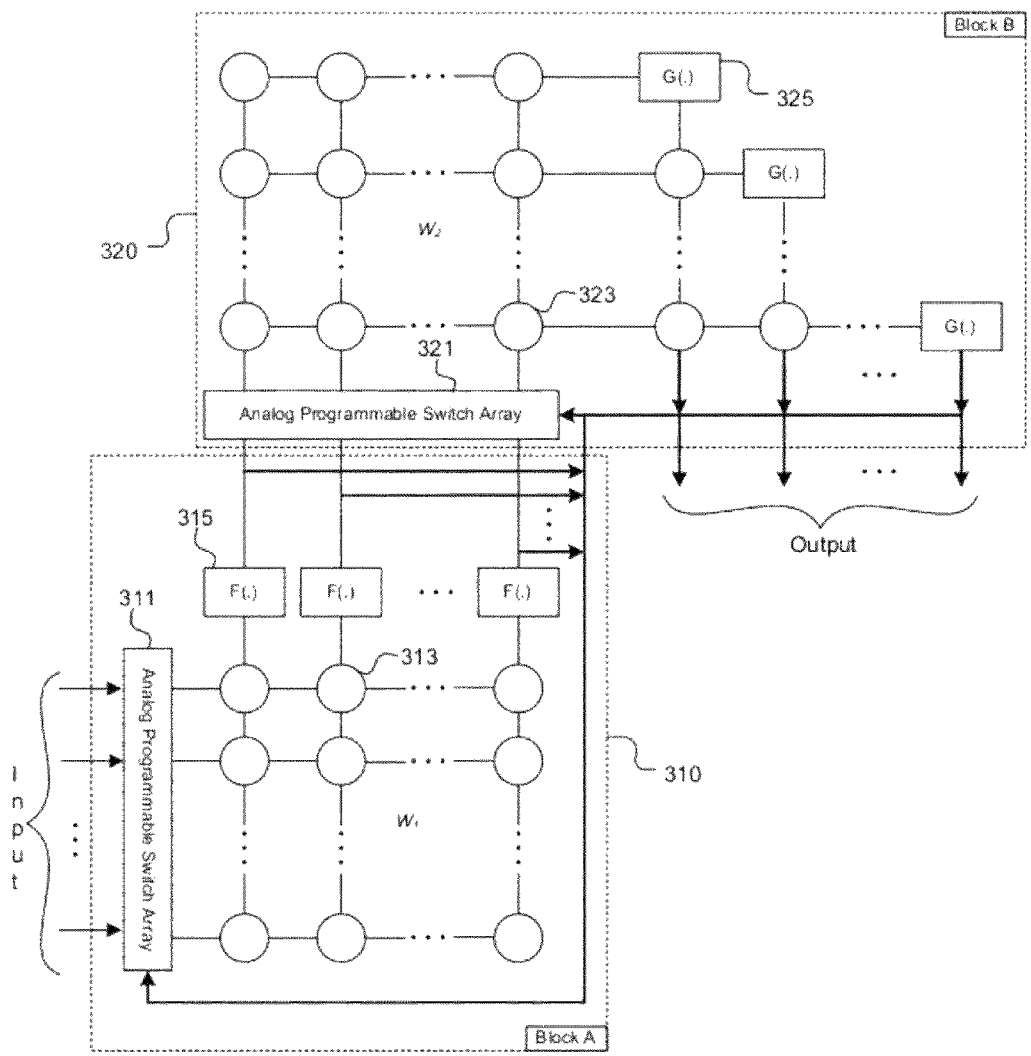
FIG. 3 shows an architecture for a Hybrid Intelligent Processor Array.

FIG. 3 shows an architecture for a Hybrid Intelligent Processor Array 220 according to an embodiment of the present invention. In this architecture, there are two blocks, A-block 310, and B-block 320. The A-block 310 comprises a programmable switch array 311, multiplication nodes 313, and transfer function elements 315. The A-block 310 receives data from the I/O bus that is routed through the switch array 311 to the multiplication nodes 313. The multiplication factors of each multiplication node 313 are defined by matrix $W_1$. The results are routed to transfer function elements 315 implementing a transfer function F(.). In a preferred embodiment of the present invention, the transfer function elements 315 comprise programmable analog filters. The transfer function F(.) may comprise linear, sigmoidal, Gaussian functions or other transfer functions. For example, to convert a signal in the time domain to a frequency domain such as Discrete Cosine Transform (DCT), a particular set of coefficient values are downloaded to the $W_1$ array, and the multiplication between the weight matrix and the input vector will result in a conversion with the output transfer function F(.) as a linear function. Moreover, the output from F(.) can be fedback to the input via a set of switches programmed in the SRAM 230. This feature allows users to be able to manipulate block-A 310 in a high order nonlinear network as needed. For example, block-A may be configured as cascading neural network architecture (see, for example, S. E. Fahlman and C. Lebiere, "The Cascade Correlation learning architecture," Advances in Neural Information Processing Systems II, Ed: D. Touretzky, Morgan Kaufmann, San Mateo, Calif., pp. 524-532, 1990 or 19. T. A. Duong and Allen R. Stubberud, "Convergence Analysis Of Cascade Error Projection—An Efficient Learning Algorithm For Hardware Implementation," International Journal of Neural System, Vol. 10, No. 3, pp. 199-210, June 2000) or a multi layered neural network (see, for example, B. Widrow, "Generalization and information storage in networks of ADALINE neurons," Ed: G. T. Yovitt, "Self-Organizing Systems," Spartan Books, Washington D.C., 1962)

The B-block 320 is cascaded with the A-block 310 in which the output of the A-block 310 can be inputted into the B-block 320. The array of the B-block 320 is similar to the A-block 310, where the B-block 320 comprises a programmable switch array 321, multiplication nodes 323, and transfer function elements 325. In a preferred embodiment of the present invention, the transfer function elements 325 comprise programmable analog filters. However, the B-block 320 is preferably implemented with a cascading architecture array rather than the squared array of the A-block 310. The transfer function G(.) is also a programmable function. The output of the B-block 320 can be programmed to feedback to the input of the B-block 320 and/or the input of the A-block 310. The programmable switches 311, 321 allow the reconfiguration of the Processor Array into a more complicated network as needed.

From block-A and block-B, each switch can be programmed to become a multi-layered neural network (MLP), cascading neural network (CNN), principle component analysis (PCA), independent component analysis, least mean-squared network (LMS), DCT, FFT, etc.

Figure 4:
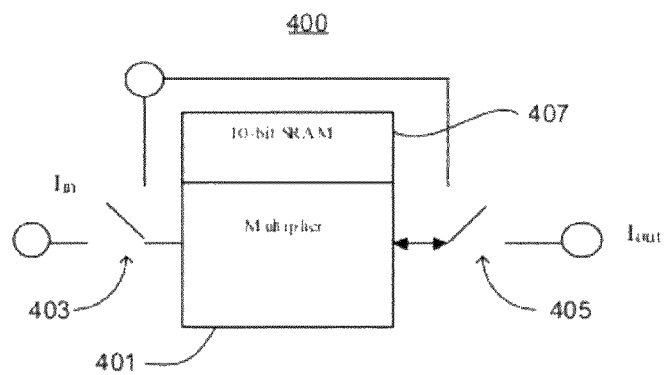
FIG. 4 shows a block diagram of a Multiplying Digital-to-Analog Converter.

The multiplication nodes 313, 323 may be implemented as 10-bit Multiplying Digital to Analog Converters (MDACs). A block diagram of an exemplary 10-bit MDAC 400 is shown in FIG. 4. The MDAC 400 implements a multiplier 401 between analog input current and a 10-bit digital weight D stored in SRAM 407, and the output of the MDAC is in a current mode. Since the MDAC operates in a current mode, multiple sources may provide current to the MDAC 400 and the MDAC 400 may provide current to multiple devices. Such a capability supports the multiple node arrays discussed above. Switches 403, 405 allow the reconfiguration of the MDAC 400 to load different multiplication factors and can be controlled from a part of SRAM block. This allows the system architecture to be flexible to achieve various tasks. The 10-bit digital weight of the MDAC 400 is provided by the elements of the $W_1$ and $W_2$ matrices. This MDAC implementation provides that the processing array may be compact, consume low power, have a relatively simple architecture, and exhibit parallelism.

Figure 5:
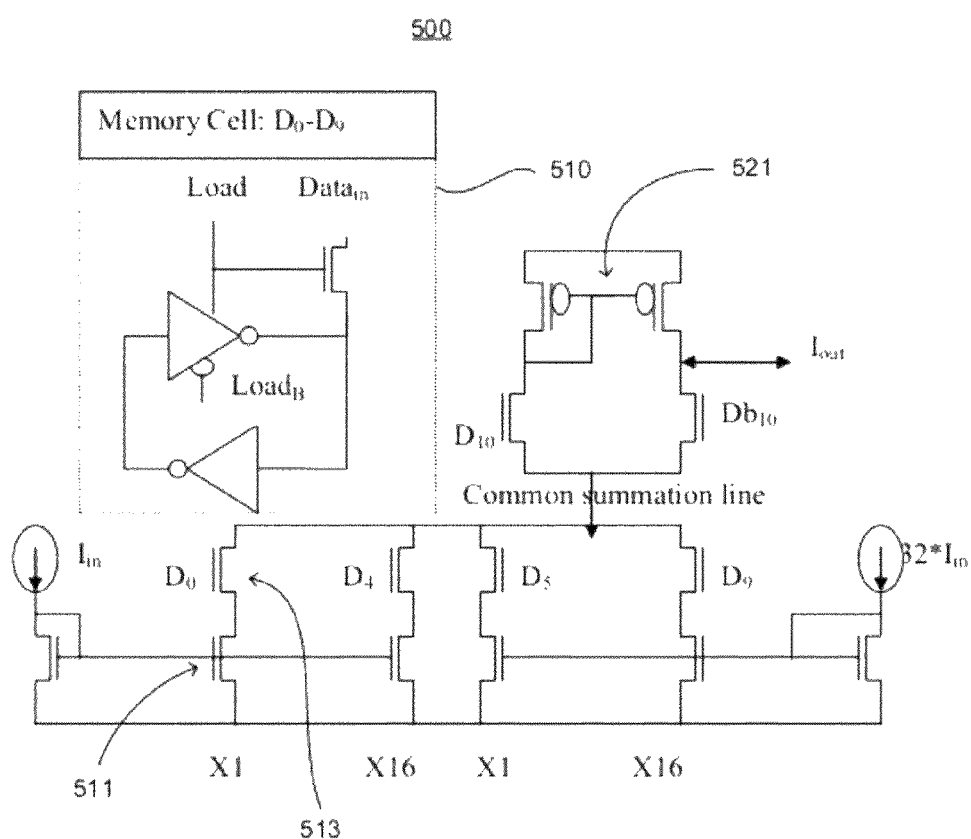
FIG. 5 shows an electrical schematic of a 10-bit Multiplying Digital-to-Analog Converter.

FIG. 5 shows an electrical schematic of an exemplary MDAC 500. In this design, the coefficient $W_N^{nk}$ can be digitized and stored into SRAM (D0-D9) and the digital signal input is converted into current $I_{in}$ and $32*I_{in}$ for optimizing the design space. The multiplier is used to multiply $W_k$ and $I_{in}$ and its result in the current mode is $I_{out}$. In FIG. 5, the dotted block 510 is an SRAM design, which will take $Data_{in}$ to $D_i$ when Load is high and store $D_i$ when Load is low (and $Load_B$ is high).

As digital $W_k$ is written into the SRAM array and $I_{in}$ is available, multiplication is accomplished by conditionally scaling the input current $I_{in}$ by a series of current mirrored transistors 511. For each current mirror, a pass transistor 513 controlled by one bit from the SRAM which conditionally allows the current to be placed on a common summation line. The bits in the digital word from LSB to MSB are connected to 1, 2, 4 . . . and 512 current mirror transistors, so that the input current is scaled by the appropriate amount. To optimize the number of current mirror transistors (the total is 1023 current minor transistors) for space and speed due to gate capacities of minor transistors, the 10-bit multiply is split into two 5-bit multiplies (two of 31 current mirror transistors) and each of them (two) is taken through different input currents: $I_{in}$ or $32*I_{in}$. The resulting summation current is unipolar. However, a current steering differential transistor pair 521, controlled by a tenth bit of the digital word, determines the direction of the current output, such that two-quadrant multiplication is accomplished (−1024 to 1024 levels).

In embodiments according to the present invention, data can come directly from sensors in an analog form. Using an analog I/O bus (such as that shown in FIG. 2), the I/O bus can digest information flow as fast as the sampling rate of the sensors. However, the raw data may expose some difficulties for reliable processing. One technique often used is a preprocessing step and this step can vary from one type of data to another. For example, the principle component analysis can be a useful tool for visual data by reducing the background, while still maintaining the principle information for processing. In such a technique, block-A 310 as shown in FIG. 3 may be used to implement preprocessing. In addition, the independent component analysis can be useful for audio sensory data to reduce cross talk and background noise. When the preprocessed filter is reconfigured and ready, a real time adaptive learning for preprocessing will take place to adapt needed information. When finished, processing units (which may be implemented in block-B 320 as shown in FIG. 3) can be reconfigured accordingly, and the learning of a suitable filter to solve the problem will be accomplished. The learning iterations and reconfiguration system can be coded as machine (i.e., instruction) code to provide instructional steps for a particular application. This machine will act as switching control to activate the information flow path for adaptive learning step. Further, multiple instantiations of the architecture shown in FIG. 3 may be cascaded into a larger system as needed for other applications.

A feature of embodiments of the present invention is the ability to dynamically reconfigure the architecture of the Processor Array. That is, in some embodiments, the data received by the Processor Array may result in the configuration of the switch array, weights used by the multiplication nodes, or the transfer functions of the transfer function elements being changed in real-time. Hence, the Processor Array may be flexibly configured to implement learning and be adaptive to the data received and the processing to be provided. This flexibility is typically not present in other digitally-based hardware platforms, such as Field Programmable Gate Arrays, Digital Signal Processors, microprocessors, etc.

As indicated above, the Processing Array may be considered as providing preprocessing with block-A and processing with block-B. The discussion below presents results that may be obtained in using the Processing Array in various applications.

Figure 6A:
FIGS. 6A-6C show the Elaine image and results from reconstructing the Elaine image.

A first application is the use of block-A as a real time adaptive PCA filter for feature extraction and data compression. Two gray scale images were used: Elaine (as shown in FIG. 6A and tank (as shown in FIG. 7A). The Elaine image consisted of 256×256 gray pixels and each pixel had 8-bit quantization. The tank was a 512×512 pixel image with 8-bit gray scale/pixel.

An input vector as row data with 64 pixels/vector was used to construct the training vector set. When the training vector set is available, the algorithm as shown in EQ. 1 below is applied to extract the principal vector. Analysis showed that the maximum number of iterations required was 150 of learning repetitions and the first 20 component vectors are extracted. Feature extraction using PCA is a well known approach (see, for example, T. A. Duong and Allen R. Stubberud, "Convergence Analysis Of Cascade Error Projection—An Efficient Learning Algorithm For Hardware Implementation," International Journal of Neural System, Vol. 10, No. 3, pp. 199-210, June 2000) and is based on the most expressive features (eigen vectors with the largest eigenvalues).

Figure 6B:
Figure 6C:
Figure 6D:
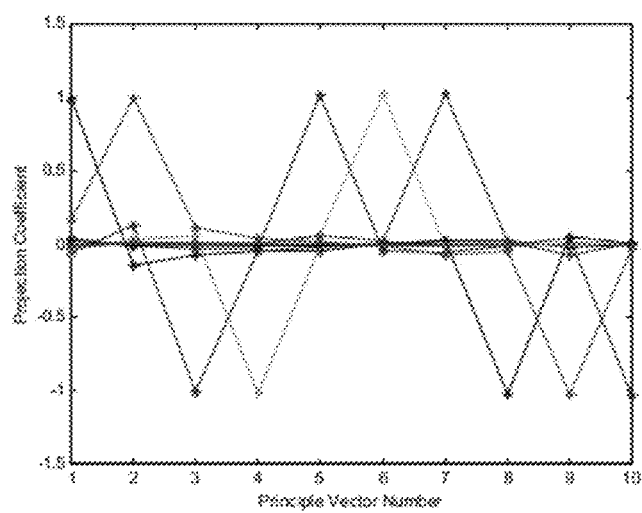
FIG. 6D shows the results of a 10 component vector extracted from the Elaine image shown in FIG. 6A.

The first 10-component vector extracted from Elaine image using the block-A architecture is projected onto the first 10-component from MATLAB (inner product) and its results are shown in FIG. 6D. The first 10-component vector extracted from tank image using MATLAB and the block-A architecture and the projection between principal vectors are shown in FIG. 7D. As orthogonal characteristics between principal vectors, if the learning component vector and the component vector from MATLAB are the same order and identical (or close to identical), the expected inner product should be close to +/−1; otherwise, it should be close to zero. As shown in FIG. 6D and FIG. 7D, there are ten values (+/−1) and the rest (70 values are close to zero) from which it may be concluded that the block-A architecture can extract the feature vector with the same results as the MATLAB technique.

A comparison of feature extraction and image reconstruction between a known MATLAB technique and use of the block-A configured for PCA was also performed. In this case, the first 20-component vector from full set of 64 component vectors was extracted. The full image was then constructed from the extracted first 20 component principal vector. FIG. 6B shows the Elaine image and FIG. 7B shows the Tank image constructed using the MATLAB technique. FIG. 6C shows the Elaine image and FIG. 7C shows the Tank image constructed using the block-A configured for PCA. These images show that the block-A implementation provides results similar to known techniques, but, given the high speed nature of the architecture, at a higher speed.

Another application is to configure block-B for color segmentation. A challenging aspect in color segmentation is when the light intensity and resolution are dynamically changing. It is easily recognized that the initial knowledge used to train the network will have very little effect at a new location and therefore will need to be updated through learning of newly extracted data.

Color segmentation may be applied to a spacecraft guidance application. In this case, the adaptation process that can aid in spacecraft guidance may be described as follows: when the network that has acquired current knowledge at time $t_0$ is used to test the subsequent image at time $t_0+\Delta t$, segmentation results from the image at $t_0+\Delta t$ will be used to extract the training set to update the previous knowledge of the network at time $t_0$. This process of repeatedly segmenting and updating is performed until a spacecraft attempting a landing on a surface reaches its destination.

While the process of segmenting and updating are desired characteristics of an adaptive processor, one issue is how often such updates are necessary. The frequency of updates has a direct impact on power consumption. More power is consumed if updates are performed between each sequential image. The problem with infrequent updates, however, is that the network may not interpolate easily based upon new images from which the newly segmented data may be insufficient for training. To find the optimal sampling rate in a landing application, $\Delta t$ should be "sufficiently small" and will depend upon the landing velocity and other environmental changes. The sampling rate becomes significant in the actual design and development of a spacecraft landing system.

To judge the applicability of the Hybrid Processor Array described above to a color segmentation environment that may be presented in a spacecraft landing environment, a simulation study was conducted based upon images synthetically derived at JPL. A digital camera was used to obtain a set of images at different times of the day, namely, at 3:00 PM, 4:00 PM, and 5:00 PM, and at different locations within the MARS YARD at the Jet Propulsion Laboratory. These images were used to validate the neural network performance with and without adaptive capabilities. In addition, images were acquired at 15 second intervals to capture effects of light intensity, contrast, and resolution for adaptive learning step.

To classify each pixel, a pixel to be classified and its immediate neighbors were used to form a 3×3 sub-window as the input training pattern (thus each input pattern has 27 elements from 3×3 of RGB pixel). Based on a previous study, the 3×3 RGB input pattern was found to be the optimal size in comparison to using a single RGB input, a 5×5 RGB sub-window, or a 7×7 RGB sub-window. In this study, the objective was to segment the image into three groups: "Rock1", "Rock2", and "Sand". The topology of the studied network was a 27×5×3 cascading architecture neural network, having 27 inputs, 5 cascaded hidden units, and 3 output units.

Figure 8A:
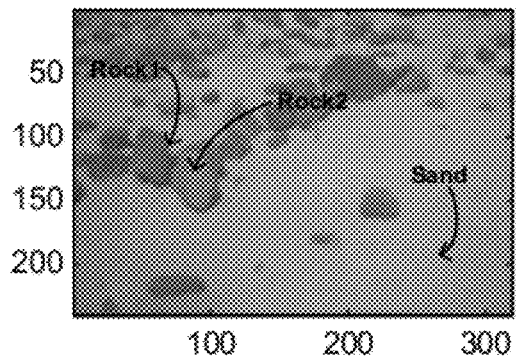
FIG. 8A shows an image of the MARS yard at the Jet Propulsion Lab at 3 PM.
Figure 8B:
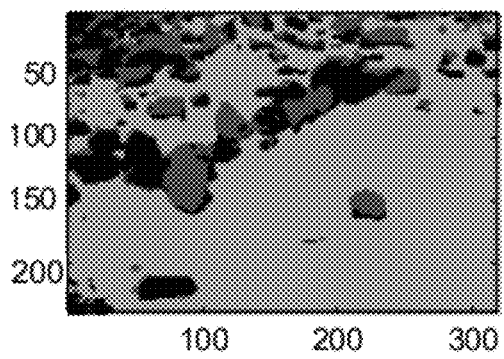
FIG. 8B shows the segmented output of the image shown in FIG. 8A.

FIG. 8A shows a 3:00 PM image. From this image, 408 patterns for training data, 588 patterns for cross validation, and 1200 patterns for testing were sampled and collected. With these sample sets, the learning was completed with 91% correct in training, 90% correct in validation, and 91% correct in testing. After training was performed, the segmented output of the original image of FIG. 8A is shown in FIG. 8B.

Figure 9A:
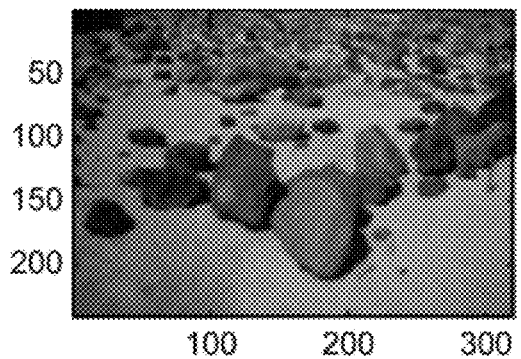
FIGS. 9A-9C show the 4 PM scene of FIG. 8A and the segmented results of that scene.
Figure 9B:
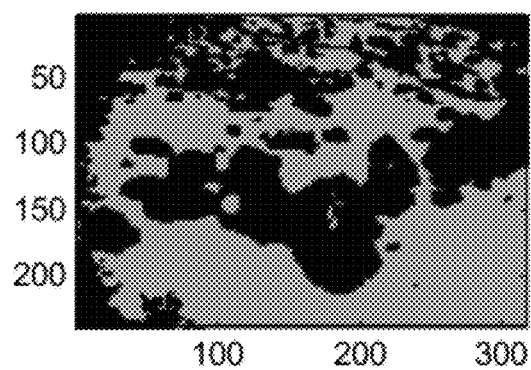
Figure 9C:
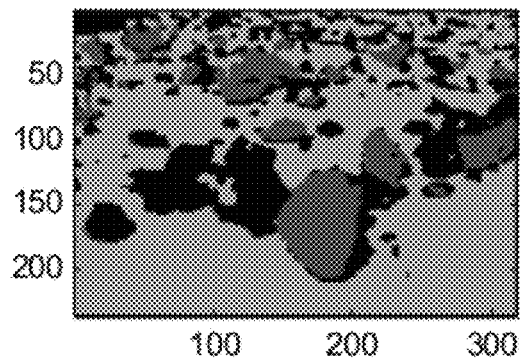

With the knowledge acquired from FIG. 8A, the network was tested with the image input shown in FIG. 9A, which was collected at 4:00 PM. The output result is shown in FIG. 9B (no intermediate adaptive step was performed). FIG. 9C is the output result with the network acquired from the intermediate knowledge through adaptive learning.

Figure 10A:
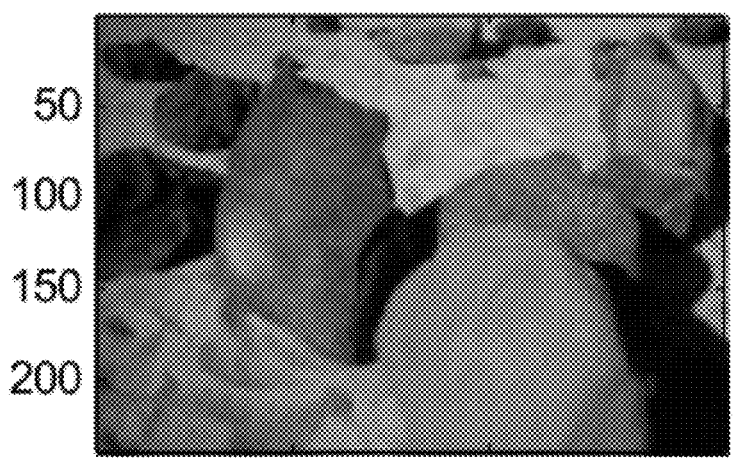
FIGS. 10A-10C show the 5 PM scene of FIG. 8A and the segmented results of that scene.
Figure 10B:
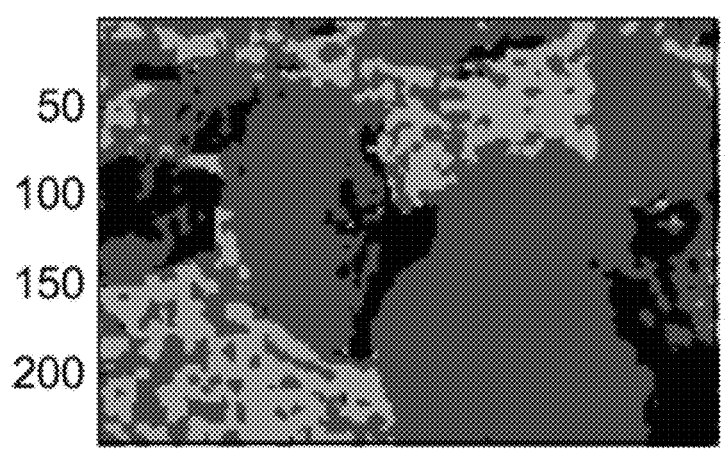
Figure 10C:
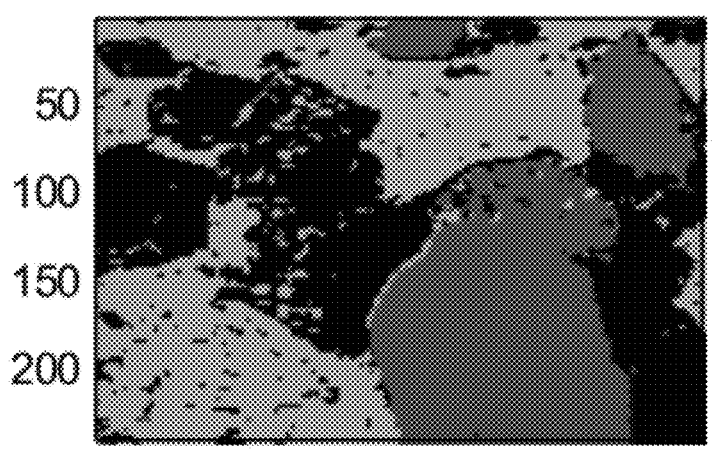

In a similar manner, the original image shown in FIG. 10A was collected at 5 PM. FIG. 10B is the segmented image with the previous training set at 4 PM and FIG. 10C is the segmented image with an intermediate adaptive step.

Based on the aforementioned results, it may be concluded that the adaptive technique is needed to obtain better segmentation when the environment is changing rapidly. For a MARS landing application, the lander would be moving with a velocity towards its landing surface. This would require an increased frequency of updates as the lander approaches the landing site. As indicated, embodiments of the present invention may support the adaptive technique that provides for the increased frequency of updates for the MARS lander application.

Still another application of an embodiment of the present invention is dynamic detection and tracking. Such an application may be based on the adaptive shape feature detection technique as U.S. patent application Ser. No. 11/498,531 filed Aug. 1, 2006 titled "Artificial Intelligence Systems for Identifying Objects." Such a technique may be considered as more robust than local tracking approaches, e.g., particular local pixel group.

Figure 11A:
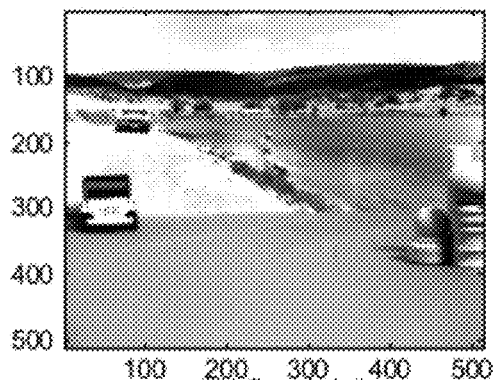
Figure 11B:
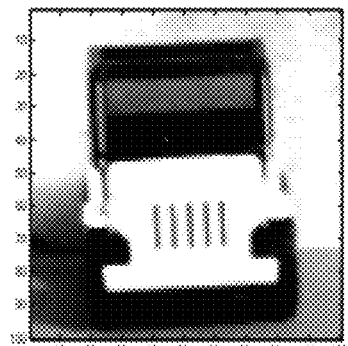
Figure 12A:
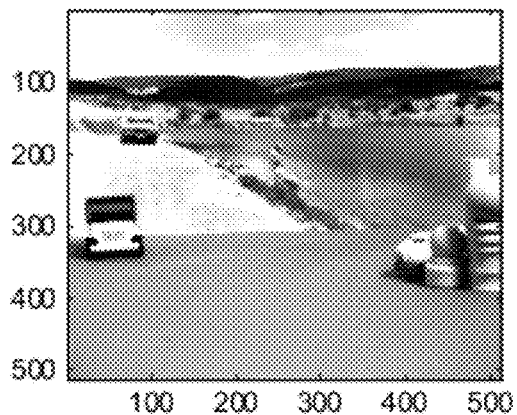
Figure 12B:
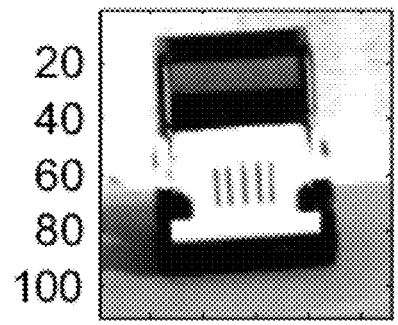
Figure 13A:
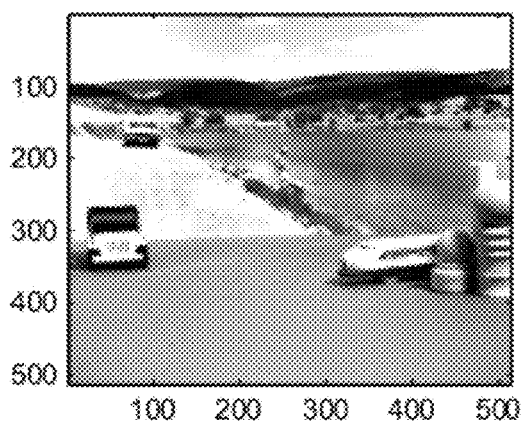
Figure 13B:
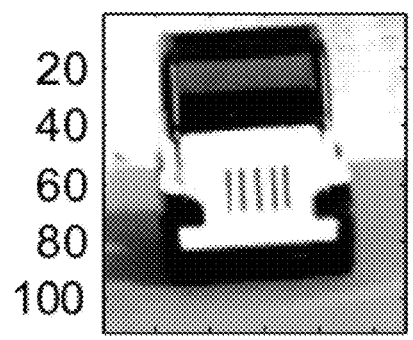
Figure 14A:
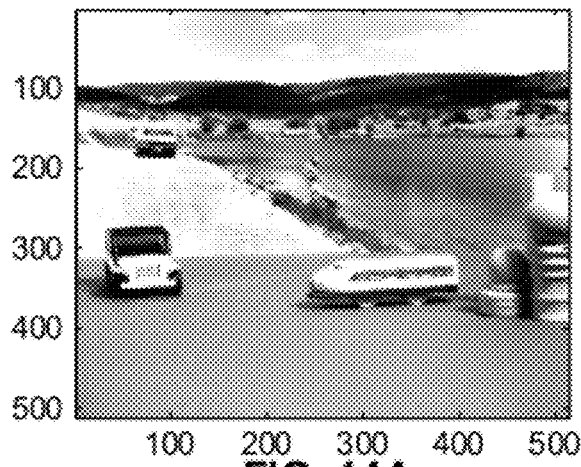
Figure 14B:
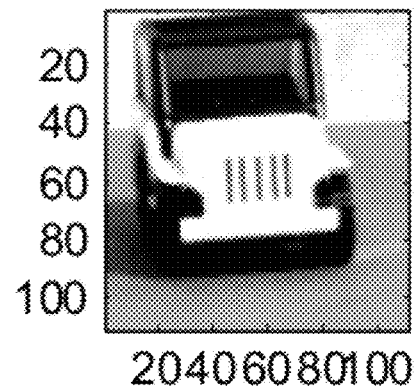
Figure 15A:
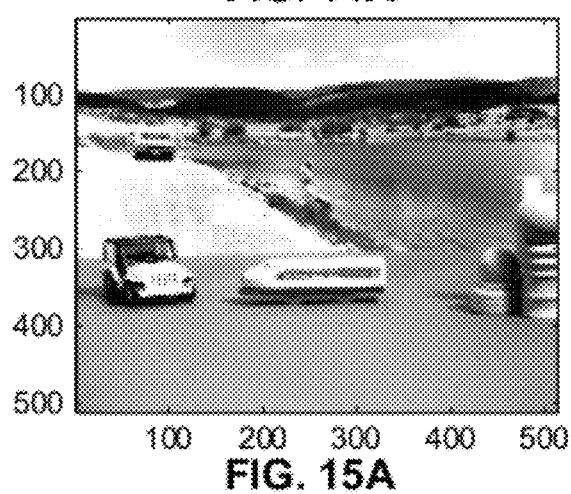
Figure 15B:
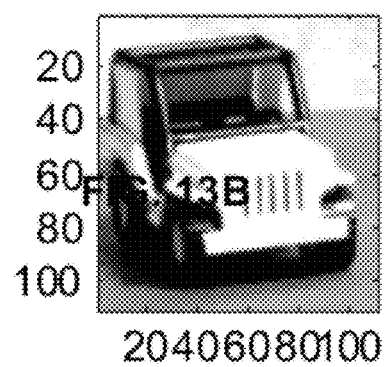
Figure 16A:
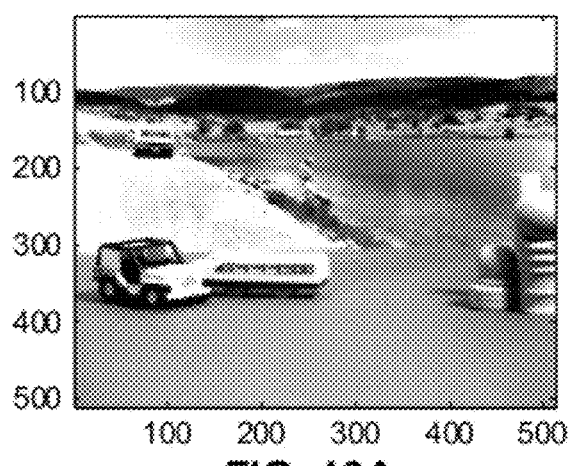
Figure 16B:
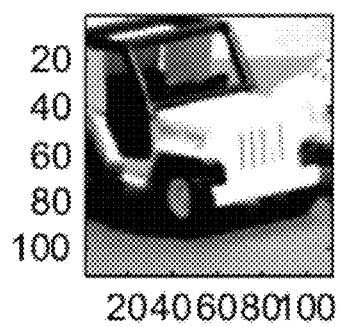

FIG. 11B shows an object present in FIG. 11A that is to be detected and tracked in subsequent images. Given the initial image in FIG. 11D, the shape feature of the object may be processed using in the preprocessing block (i.e., Block A) of the Hybrid Processor Array discussed above for detection and tracking. When processing of the images of FIG. 11A and FIG. 11B is completed, the result is tested in the scene of shown in FIG. 12A and autonomously found the similar object shown in FIG. 12B. The object shown in FIG. 12B was adapted for a current dynamic and used to test FIG. 13A and autonomously found the similar object shown in FIG. 13B from the object shown in FIG. 12B. Remaining FIGS. 14A through 19B show the detection and tracking of the objects shown in FIGS. 14B, 15B, 16B, 17B, 18B, and 19B from the scenes shown in FIGS. 14A, 15A, 16A, 17A, 18A, and 19A. From these figures, it can be seen that the Hybrid Processor Array may successfully detect the moving car in the dynamic scene.

In another application of an embodiment of the present invention, analysis of sensor responses may be employed for the detection of chemical compounds in an open and changing environment, such as a building or a geographical area where air exchange is not controlled and limited. To search for a chemical compound to determine if it exists in the operating environment, a Spatial Invariant Independent Component Analysis (SPICA), such as that described in T. A. Duong, M. Ryan and V. A. Duong, "Smart ENose for Detection of Selective Chemicals in an Unknown Environment." Special issue of Journal of Advanced Computational Intelligence and Intelligent Informatics, Vol. 11, No. 10, pp. 1197-1203, 07, may be used to separate and detect the mixtures in the open environment.

Figure 20A:
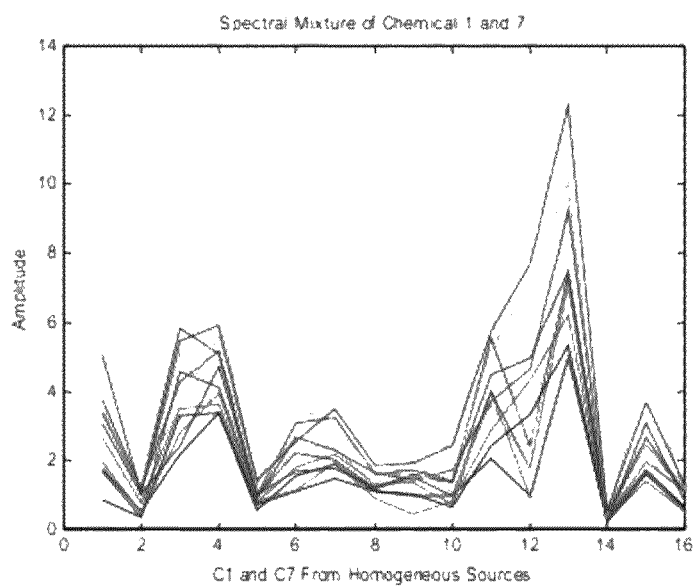
FIGS. 20A-20C show the mixing of odorants within an environment, the detection of those odorants, and the actual odorant composition of the environment.
Figure 20B:
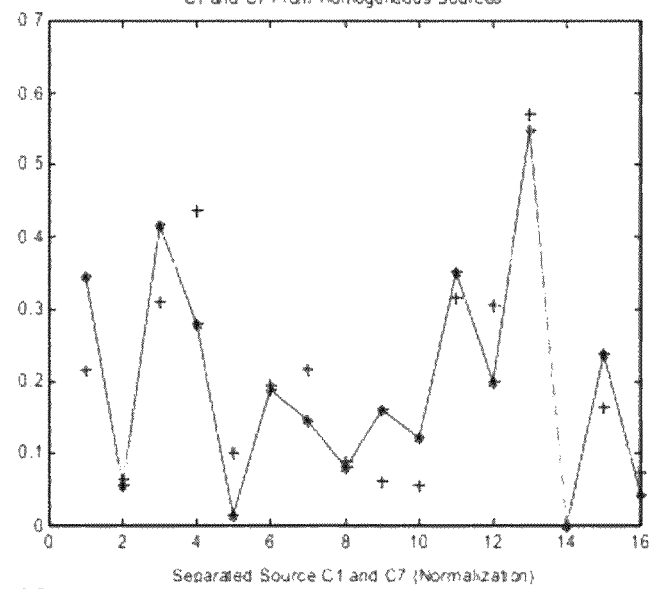
Figure 20C:
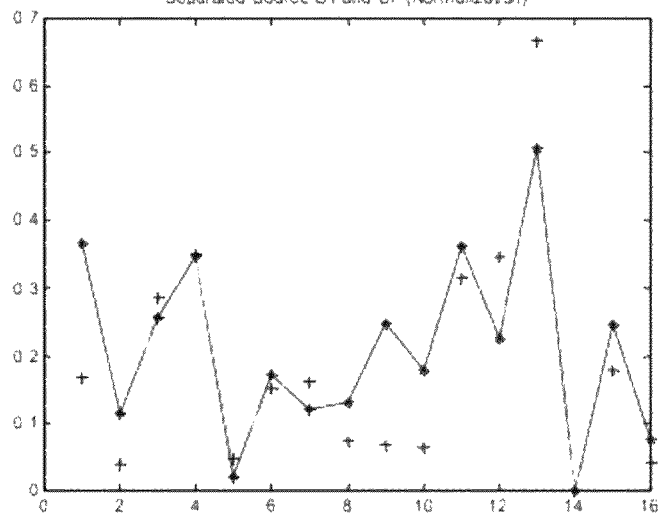

SPICA can be embedded in an embodiment of the Hybrid Processor Array described above using both Blocks A and B. FIG. 20A shows the mixing of two unknown odorants at unknown concentrations. FIG. 20B shows the odorants detected by the SPICA processing performed by an embodiment of the present invention. FIG. 20C shows the actual odorant composition of these mixtures. Hence, it may be concluded that an embodiment of the present invention may be used for detecting chemicals in an unknown environment.

No limitation is intended by the description of exemplary embodiments which may have included tolerances, feature dimensions, specific operating conditions, engineering specifications, or the like, and which may vary between implementations or with changes to the state of the art, and no limitation should be implied therefrom. In particular it is to be understood that the disclosures are not limited to particular compositions or biological systems, which can, of course, vary. This disclosure has been made with respect to the current state of the art, but also contemplates advancements and that adaptations in the future may take into consideration of those advancements, namely in accordance with the then current state of the art. It is intended that the scope of the invention be defined by the Claims as written and equivalents as applicable. It is also to be understood that the terminology used herein is for the purpose of describing particular embodiments only, and is not intended to be limiting. Reference to a claim element in the singular is not intended to mean "one and only one" unless explicitly so stated. As used in this specification and the appended claims, the singular forms "a," "an," and "the" include plural referents unless the content clearly dictates otherwise. The term "several" includes two or more referents unless the content clearly dictates otherwise. Unless defined otherwise, all technical and scientific terms used herein have the same meaning as commonly understood by one of ordinary skill in the art to which the disclosure pertains.

Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising step(s) for . . . "

A number of embodiments of the disclosure have been described. Nevertheless, it will be understood that various modifications may be made without departing from the spirit and scope of the present disclosure. Accordingly, other embodiments are within the scope of the following claims.

What is claimed is:

1. A system for processing sensor data comprising:
   an input/output bus, wherein the input/output bus receives sensor data and outputs processed sensor data;
   a processor array, wherein the processor array receives analog signals containing sensor data from the input/output bus and the processor array comprises one or more matrices of analog multiplication nodes and transfer function elements and the processor array outputs the processed sensor data from the one or more matrices of analog multiplication nodes and transfer function elements; and
   a memory containing data values controlling configurations of the processor array,
   wherein the processor array comprises:
   a first array block, the first array block comprising:
      a first programmable switch array configured to receive the sensor data;
      a square array of first array analog multiplication nodes, wherein each first array multiplication node selectively receives analog signals from the first programmable switch array, or one or more first array multiplication nodes, or the first programmable switch array and one or more first array multiplication nodes; and one or more first array transfer function elements, wherein each first array transfer function elements receives analog signals from one of the first array analog multiplication nodes, and a second array block, the second array block comprising:

a second programmable switch array configured to receive signals from the one or more first array transfer function elements;

a cascaded array of second array analog multiplication nodes;

one or more second array transfer function elements, wherein each second array transfer function element receives analog signals from one of the second array analog multiplication nodes;

wherein each second array multiplication node selectively receives analog signals from the second programmable switch array, one or more second array multiplication nodes, the second programmable switch array and one or more second array multiplication nodes, or one of the one or more second array transfer function elements.

2. The system according to claim 1, wherein outputs from one or more of the first array transfer function elements are selectively coupled to the first programmable switch array as inputs to the first programmable switch array.

3. The system according to claim 2, wherein outputs from one or more of the second array transfer function elements, or outputs from one or more of the second array transfer function elements, or outputs from one or more of the second array transfer function elements and outputs from one or more of the second array transfer function elements are selectively coupled to the second programmable switch array as inputs to the second programmable switch array and selectively coupled to the first programmable switch array as inputs to the first programmable switch array.

4. The system according to claim 1, wherein outputs from one or more of the second array transfer function elements, or outputs from one or more of the second array transfer function elements, or outputs from one or more of the second array transfer function elements and outputs from one or more of the second array transfer function elements are selectively coupled to the second programmable switch array as inputs to the second programmable switch array.

5. The system according to claim 1, wherein the memory contains data values for selectively controlling the first programmable switch array or the second programmable switch array or the first programmable switch array and the second programmable switch array.

6. The system according to claim 1, wherein the memory contains data values for controlling multiplication factors for one or more of the first array multiplication nodes and second array multiplication nodes.

7. The system according to claim 6, wherein one or more of the first array multiplication nodes and second array multiplication nodes comprise a current mode multiplying digital to analog converter having a digital multiplication factor stored in the memory.

8. The system according to claim 1, wherein data values in the memory are modified based upon the processed sensor data.

9. The system according to claim 1, wherein the transfer function elements comprise programmable analog filters.

10. A method for processing sensor data comprising:

receiving sensor data in a plurality of first analog data streams;

applying a first set of multiplicative weights to the plurality of first analog data streams to produce a plurality of first multiplied analog data streams;

filtering the plurality of first multiplied analog data streams based on a first set of filter characteristics to produce a plurality of preprocessed analog data streams;

providing a plurality of second analog data streams based on the plurality of preprocessed analog data streams;

applying a second set of multiplicative weights to the plurality of second analog data streams to produce a second plurality of multiplied analog data streams;

filtering the second plurality of multiplied analog data streams based on a second set of filter characteristics to produce a plurality of processed analog data streams; and outputting the plurality of processed analog data streams to produce processed sensor data, wherein the plurality of first analog data streams comprises: sensor data, sensor data and the plurality of preprocessed analog data streams; sensor data and the plurality of processed data streams; or sensor data and the plurality of preprocessed analog data streams and the plurality of processed data streams, wherein the plurality of second analog data streams comprises: the plurality of preprocessed analog data streams, or the plurality of preprocessed analog data streams and the plurality of processed analog data streams, and wherein applying a first set of multiplicative weights comprises selectively directing the plurality of analog streams to a plurality of first multiplication nodes, wherein each first multiplication node multiplies a first multiplication node input by a weight selected from the first set of multiplicative weights to produce a first multiplication node output, wherein the first multiplication node input comprises: one analog data steam of the plurality of analog data streams; a first multiplication node output from another first multiplication node; or a sum of one analog data steam of the plurality of analog data streams and a first multiplication node output from another first multiplication node, and wherein first multiplication node outputs from selected first multiplication nodes comprise the first plurality of multiplied analog data streams.

11. A method for processing sensor data comprising:

receiving sensor data in a plurality of first analog data streams;

applying a first set of multiplicative weights to the plurality of first analog data streams to produce a plurality of first multiplied analog data streams;

filtering the plurality of first multiplied analog data streams based on a first set of filter characteristics to produce a plurality of preprocessed analog data streams;

providing a plurality of second analog data streams based on the plurality of preprocessed analog data streams;

applying a second set of multiplicative weights to the plurality of second analog data streams to produce a second plurality of multiplied analog data streams;

filtering the second plurality of multiplied analog data streams based on a second set of filter characteristics to produce a plurality of processed analog data streams; and outputting the plurality of processed analog data streams to produce processed sensor data, wherein the plurality of first analog data streams comprises: sensor data, sensor data and the plurality of preprocessed analog data streams; sensor data and the plurality of processed data streams; or sensor data and the plurality of preprocessed analog data streams and the plurality of processed data streams, wherein the plurality of second analog data streams comprises: the plurality of preprocessed analog data streams, or the plurality of preprocessed analog data streams and the plurality of processed analog data streams, and wherein filtering the first plurality of multiplied analog data streams comprises:

providing an array of first analog filters, each first analog filter having a first analog filter input and a first analog filter output and a first analog filter characteristic selected from the selected first filter characteristics; and, directing each multiplied analog data stream of the first plurality of multiplied analog data streams into a first analog filter input of a selected first analog filter, wherein first analog filter outputs comprise the plurality of preprocessed analog data streams.

12. A method for processing sensor data comprising:

receiving sensor data in a plurality of first analog data streams;

applying a first set of multiplicative weights to the plurality of first analog data streams to produce a plurality of first multiplied analog data streams;

filtering the plurality of first multiplied analog data streams based on a first set of filter characteristics to produce a plurality of preprocessed analog data streams;

providing a plurality of second analog data streams based on the plurality of preprocessed analog data streams;

applying a second set of multiplicative weights to the plurality of second analog data streams to produce a second plurality of multiplied analog data streams;

filtering the second plurality of multiplied analog data streams based on a second set of filter characteristics to produce a plurality of processed analog data streams; and outputting the plurality of processed analog data streams to produce processed sensor data wherein the plurality of first analog data streams comprises: sensor data, sensor data and the plurality of preprocessed analog data streams; sensor data and the plurality of processed data streams; or sensor data and the plurality of preprocessed analog data streams and the plurality of processed data streams, wherein the plurality of second analog data streams comprises: the plurality of preprocessed analog data streams, or the plurality of preprocessed analog data streams and the plurality of processed analog data streams, and wherein applying a second set of multiplicative weights comprises:

selectively directing the plurality of preprocessed analog data streams to a plurality of second multiplication nodes, wherein each second multiplication node multiplies a second multiplication node input by a weight selected from the second set of multiplicative weights to produce a second multiplication node output, wherein the second multiplication node input comprises: one preprocessed analog data steam of the plurality of preprocessed analog data streams; a second multiplication node output from another second multiplication node; or a sum of one preprocessed analog data steam of the plurality of preprocessed analog data streams and a second multiplication node output from another second multiplication node, and wherein second multiplication node outputs from selected second multiplication nodes comprise the second plurality of multiplied analog data streams.

13. A method for processing sensor data comprising:

receiving sensor data in a plurality of first analog data streams;

applying a first set of multiplicative weights to the plurality of first analog data streams to produce a plurality of first multiplied analog data streams;

filtering the plurality of first multiplied analog data streams based on a first set of filter characteristics to produce a plurality of preprocessed analog data streams;

providing a plurality of second analog data streams based on the plurality of preprocessed analog data streams;

applying a second set of multiplicative weights to the plurality of second analog data streams to produce a second plurality of multiplied analog data streams;

filtering the second plurality of multiplied analog data streams based on a second set of filter characteristics to produce a plurality of processed analog data streams; and outputting the plurality of processed analog data streams to produce processed sensor data wherein the plurality of first analog data streams comprises: sensor data, sensor data and the plurality of preprocessed analog data streams; sensor data and the plurality of processed data streams; or sensor data and the plurality of preprocessed analog data streams and the plurality of processed data streams, wherein the plurality of second analog data streams comprises: the plurality of preprocessed analog data streams, or the plurality of preprocessed analog data streams and the plurality of processed analog data streams, and wherein filtering the second plurality of multiplied analog data streams comprises:

providing an array of second analog filters, each second analog filter having a second analog filter input and a second analog filter output and a second analog filter characteristic selected from the selected second filter characteristics; and, selectively directing each multiplied analog data stream of the second plurality of multiplied analog data streams to a second analog filter input of a selected second analog filter or to a selected third multiplication node of a plurality of third multiplication nodes, wherein each third multiplication node multiplies a third multiplication node input by a weight selected from a third set of multiplicative weights selected from the second filter characteristics to produce a third multiplication node output, wherein the third multiplication node input comprises: a selected second analog filter output; a third multiplication node output from another third multiplication node; or a sum of a selected second analog filter output and a third multiplication node output from another third multiplication node; and selectively directing each second analog filter output to a selected third multiplication node of a plurality of third multiplication nodes or to the plurality of processed analog data streams.

14. A method for processing sensor data comprising:

receiving sensor data in a plurality of first analog data streams;

applying a first set of multiplicative weights to the plurality of first analog data streams to produce a plurality of first multiplied analog data streams;

filtering the plurality of first multiplied analog data streams based on a first set of filter characteristics to produce a plurality of preprocessed analog data streams;

providing a plurality of second analog data streams based on the plurality of preprocessed analog data streams;

applying a second set of multiplicative weights to the plurality of second analog data streams to produce a second plurality of multiplied analog data streams;

filtering the second plurality of multiplied analog data streams based on a second set of filter characteristics to produce a plurality of processed analog data streams;

outputting the plurality of processed analog data streams to produce processed sensor data; and selecting or modifying at least one of the following sets based upon the processed sensor data: the first set of multiplicative weights; the first set of filter characteristics; the second set of multiplicative weights; and, the second set of filter characteristics.

15. A method for processing sensor data comprising:

receiving sensor data in a plurality of first analog data streams;

applying a first set of multiplicative weights to the plurality of first analog data streams to produce a plurality of first multiplied analog data streams;

filtering the plurality of first multiplied analog data streams based on a first set of filter characteristics to produce a plurality of preprocessed analog data streams;

providing a plurality of second analog data streams based on the plurality of preprocessed analog data streams;

applying a second set of multiplicative weights to the plurality of second analog data streams to produce a second plurality of multiplied analog data streams;

filtering the second plurality of multiplied analog data streams based on a second set of filter characteristics to produce a plurality of processed analog data streams; and outputting the plurality of processed analog data streams to produce processed sensor data, wherein the processed sensor data provides knowledge about a sensor environment and the method further comprises selecting or modifying at least one of the following sets based upon the sensor environment knowledge: the first set of multiplicative weights; the first set of filter characteristics; the second set of multiplicative weights; and, the second set of filter characteristics.

\* \* \* \* \*